United States Patent [19]
Umehara et al.

[11] Patent Number: 5,920,116
[45] Date of Patent: Jul. 6, 1999

[54] RIGIDIZED LEAD FRAME FOR A SEMICONDUCTOR DEVICE

[75] Inventors: Norito Umehara; Akira Karashima, both of Oita, Japan

[73] Assignee: Texas Instruments Incorporated, Dallas, Tex.

[21] Appl. No.: 08/757,880

[22] Filed: Nov. 27, 1996

[51] Int. Cl.[6] .................. H01L 23/495; H01L 23/28; H01L 23/50
[52] U.S. Cl. .................. 257/669; 257/666; 257/672; 257/674; 257/692; 257/696; 257/698
[58] Field of Search .................. 257/678, 666, 257/667, 669, 672, 674, 676, 692, 698, 696

[56] References Cited

U.S. PATENT DOCUMENTS

| | | | |
|---|---|---|---|
| 4,797,726 | 1/1989 | Manube | 257/669 |
| 4,942,452 | 7/1990 | Kitano et al. | 257/676 |
| 5,175,610 | 12/1992 | Kobayashi | 257/676 |
| 5,214,307 | 5/1993 | Davis | 257/666 |
| 5,397,915 | 3/1995 | Nose | 257/676 |
| 5,578,871 | 11/1996 | Fierkens | 257/676 |
| 5,623,123 | 4/1997 | Umehara | 257/676 |
| 5,637,913 | 6/1997 | Kajihara et al. | 257/676 |

FOREIGN PATENT DOCUMENTS

| | | | |
|---|---|---|---|
| 1-67950 | 3/1989 | Japan | 257/676 |
| 1-251748 | 10/1989 | Japan | 257/676 |
| 4-15945 | 1/1992 | Japan | 257/676 |
| 6-132443 | 5/1994 | Japan | 257/667 |

*Primary Examiner*—Alexander Oscar Williams
*Attorney, Agent, or Firm*—William B. Kempler; Richard L. Donaldson

[57] ABSTRACT

In semiconductor device fabrication, warping of the support pins must be prevented so that the semiconductor element can be properly positioned during the wire-bonding and resin-sealing processes. The invention provides a process in which a V-shaped groove 33, for example, is formed in the mounting pad 31 and the support pins 32, imparting rigidity to the support pins 32.

16 Claims, 13 Drawing Sheets

RIGIDIZED LEAD FRAME FOR A SEMICONDUCTOR DEVICE

FIELD OF THE INVENTION

The present invention relates to a semiconductor device, and more particularly to a semiconductor integrated circuit chip (hereafter IC chip or integrated circuit element) package, its manufacturing method, and lead frame.

BACKGROUND OF THE INVENTION

The devices shown in FIGS. 30 and 31 are conventional IC chip mounting structures for which lead frame element 1 shown in FIG. 32 can be used. The entire body of lead frame 1 can be formed of a metal (for example, alloy 42, materials to which an iron/nickel alloy plating is applied after forming, copper alloys, copper, or the like), and a lead frame section 8 can be made of a lead frame external framework 2 and a large number of internal leads 7 extending radially to locations on the interior sides of the lead frame, integrally formed by etching, stamping, or the like.

In the lead frame section 8, each of outer leads 6 were connected by connecting sections 9 (dam bars) of a wire form at each of its sides, and these connecting sections were integrally formed with the external framework 2 at each corner of the lead frame section 8.

An IC chip 10 is mounted on a rectangular mounting pad 11 (die pad) of larger surface area than the chip. Support pins 12 which support the mounting pad connect to the mounting pad 11, and are integrally formed with the external framework 2 at the corners. FIG. 4 shows a slot used for the lead frame element positioning.

Using the lead frame element 1 made in this manner, IC chip 10, shown in FIGS. 30 and 31, is affixed on top of mounting pad 11 with a silver paste 14, pad 17 is bonded to inner lead 7 by wire 15, and then the entire body sealed with a resin 16 such as an epoxy resin. In FIG. 31, a single dot segmented line shows the outer line of the resin of the sealing resin 16, and a double dot segmented line shows the position of the IC chip 10.

In the manufacture of this package 13, first, as shown in an enlarged view in FIG. 33, the IC chip 10 is mounted on top of mounting pad 11 by silver paste 14. Then, as shown in FIG. 34, during wire bonding, a heating element 18 (heater insert or heating block) is made to contact the mounting pad 11 from below, and simultaneously with supporting the mounting pad 11, heat from the heater propagates to the bonding section (pad) 17.

The wire bonding is conducted by attaching a wire 15 by a capillary 19 to a bonding pad 17 while applying heat and ultrasonic energy, and then directing inner leads 7 as shown by the arrow 20 and pressure bonding.

In this prior art package construction mounting pad 11 for the IC chip 10 is larger than IC chip 10, mainly for the following reasons. First, at the time of the bonding, assuming that the mounting pad 11 was made smaller than the IC chip 10, the IC chip 10 was supported by the mounting pad 11 only in the center section, and because the edges of the chip were unsupported, the IC chip 10 tipped during the application of ultrasound due to capillary 19, it became unstable, the ultrasonic energy could not be used efficiently, and, because the heat from the heater insert 18 was not transmitted to the IC chip 10 efficiently, the bonding was incomplete. Thus, making the mounting pad 11 smaller than the IC chip 10 was ill-considered by persons in the industry.

At the time of positioning the resin-sealed package 13 in the desired position in relation to the circuit pattern on top of the printed circuit board and fixing by soldering by solder reflow or the like, cracks appeared in the resin 16 due to thermal shock.

Until now, if the total thickness of the package 13 was sufficient, cracks did not readily appear, but with the recent change to a thinner package and a larger chip, and with the small mounting pad 11, the boundary surface of the resin 16 easily peels and cracks entering from the edge of the pad 11 are frequently observed.

This is because if the ambient moisture where the package is stored penetrates into the resin, and that moisture is present in the spaces between the lead frame and the resin during the solder reflow, the moisture changes to steam, abruptly expands, and a so-called steam explosion occurs, where the resin peels from the lead frame.

Due to the differences in the thermal expansion coefficients of the mounting pad, IC chip, and the resin, distortion remains in the package after the resin molding and completion of the curing, warpage is generated, and there are cases in which the package itself becomes completely deformed.

Another cause of the cracks can be suggested: because the silver paste 14 used to adhere the IC chip 10 is extremely moist, it may bring about a steam explosion during heating, such as during solder reflow.

Due to the same type of phenomenon as was mentioned above, and due to the moisture that has collected in the area of the silver paste 14, bringing about a steam explosion, pad 11 deforms, the resin 16 is stressed, and cracks appear, especially from the edge of the pad 11.

Therefore, the inventors of the present invention, in order to solve the defects in the package construction of the prior art, have already proposed a mounting pad construction that is smaller than the IC chip by the Japanese Patent Application No. Hei 5[1993]-165248 (hereinafter referred to as the invention of the previous application). This mounting pad construction is like that shown, for example, in FIG. 35, and according to this mounting pad construction, remarkable effects can be obtained such as (1) to (5) below.

(1) Because the mounting pad 27 is small, the trapped moisture that has penetrated into the vicinity of the pad 27 is reduced by the corresponding amount, the distortion due to the differences in the thermal expansion and contraction between the pad 27 and the resin becomes smaller, there is no peeling between the pad 27 and the resin 16 due to the steam explosions as was described above during heating (for example, during solder reflow), and the appearance of cracks in the resin is eliminated, or the cracks are significantly reduced.

(2) In this case, due to the fact that in general the adhesion between the silicon (IC chip 10) and the epoxy resin (sealing resin 16) is extremely good, since the resin 16 directly adheres to the IC chip 10 in the periphery of the pad 27, it is difficult for peeling to occur between the interface of the resin 16 and the IC chip 10, and the possibility that the moisture will collect in this boundary and cause a steam explosion is reduced one order of magnitude.

(3) Moreover, since the silver paste 14 fills the depression 27a that is provided in the pad 31, and does not protrude out from the joint face of the IC chip 10 and pad 27, and because the amount of silver paste that is used can be reduced, in addition to reducing the cost, the release and diffusion of moisture, and furthermore, the release of absorbed gases which originate in the silver paste becomes slight, and cracks are not generated in the resin 16 due to steam explosions, or the cracks can be significantly reduced. One can get by without using an epoxy resin having a low stress for the resin 16, and thus, the amount of gas released from the silver paste can be further reduced.

(4) Because the silver paste 14 fills in the depression 27a, the total thickness of the mounting pad 27, the silver paste 14, and the IC chip 10 becomes thinner just by the thickness of the silver paste (for example, about 30 μm) compared to the prior example of FIG. 30, and the total thickness can be reduced when forming the package.

(5) Because the mounting pad 27 is smaller than the IC chip 10, the size of the chip does not depend on the size of the mounting pad 27, and a greater number of chip sizes can be mounted.

Because the manufacturing method for a package based on the present invention of the previous application uses a heater that is provided in the insertion cavity of the mounting pad 27, and the bonding can be conducted by directly supporting the IC chip 10 on its periphery, it exhibits the remarkable operating effects described in (6) and (7) below.

(6) At the time of wire bonding, even though the mounting pad 27 is small, this can be positively supported on top of the heater; moreover, the support is more stable because the pad 27 is inserted inside the concave area of the heater. Therefore, the wire bonding can be stably accomplished.

(7) Since the IC chip 10 is made to directly contact the heater, the heat transmission from the heater to the IC chip (in particular, pad 17) is excellent and the ultrasonic energy is not lost, the bonding strength can be excellently maintained, and even if the ultrasonic energy of the capillary 19 and the heat from the heater are lowered, it is still possible to conduct sufficient bonding.

However, in the case in which the pad is smaller than the IC chip but larger than the width of the support pin 28 (hereinafter called a small pad), in contrast to the advantages just discussed, there are the disadvantages described below, and the inventors of the present invention found that there is more room for improvement in the invention of the previous application.

As for the misalignment of the mounting pad 27 (die pad), as shown in FIG. 36, depending on the thickness of the IC chip 10 that is arranged on top of it and the thickness of the mounting pad 27, a flat step difference D of 0.17 to 0.22 mm is formed between the inner lead 7 and the mounting pad 27 and the support pin 28. As shown in FIG. 36, it is set between the bottom mold 25a and the top mold 25b of the package resin molding metal mold, and an epoxy type resin 16 is injected from the ejection nozzle 26 and it is resin sealed. At this time, the horizontal step difference D is provided so that the ejected resin 16 flows uniformly in the space in the upper and lower cavities within the mold, and the IC chip 10 is made to occupy a central position.

In order for the semiconductor device to be properly sealed by the resin 16 being injected uniformly in the upper and lower mold cavities by centering the IC chip 10, it is very important that the semiconductor device to be resin-sealed is first supported and held at the proper position.

However, as shown in FIG. 35, because the diameter of the support pins 28 of the small pad 27 decreases, the length increases by exactly the amount that the diameter of the pad 27 is reduced, so their bending strength is reduced. Therefore, as shown in FIG. 34, during wire bonding, due to the tension of the bonding wire 15, the support pins 28 are pulled by the bonding wire 15, as shown in FIG. 37, and are bent in the direction of the arrow B.

Thus, as shown in FIG. 37, if the resin-sealing is conducted with the IC chip 10 lifted up, because the volume of the cavity of the bottom mold increases, the resin 16 quickly flows into the cavity of the bottom mold. Therefore, due to the pressure of the resin 16 that has flowed in, the IC chip 10 is pushed up still more, and as a result, it is resin-sealed in the state shown in FIG. 38.

The purpose of the present invention is to offer a semiconductor device, its manufacturing method, and lead frame, where the bending of the support pin in the manufacturing processes, such as at the time of wire bonding and at the time of resin sealing, can be significantly reduced or prevented.

SUMMARY OF INVENTION

The inventors of the present invention, as a result of diligent research in order to solve the problems, came to the conclusion that it was necessary to increase the bending strength of support pins 28 themselves so that the support pins 28 did not bend by yielding to the tension of the bonding wire 15 during wire bonding, and arrived at the present invention.

In other words, the present invention has support pins for supporting the mounting section for the semiconductor element, and the semiconductor device has a reinforcing means is added to at least a portion of these support pins, and a lead frame which has the support pins and the mounting sections.

The present invention provides a manufacturing method for a semiconductor device where a heating element is made to contact the semiconductor element mounting section of the lead frame and the support pins, and bonds the inner lead section of the lead frame to the conductor element that is fixed on top of the mounting section.

In the semiconductor device of the present invention, it is preferable that the semiconductor element be bonded to the inner lead section at the side of its circuit forming surface, that support pins be connected to the mounting pad for the semiconductor element, and it is preferable that the semiconductor element be resin-sealed when mounted on the mounting pad. The term "circuit forming surface" indicates the surface on which the circuit is formed, for example, the bonding pad 17 described below is formed on this surface.

Here, it is preferable that the mounting pad be formed smaller than the surface area of the semiconductor element.

It is preferable that the reinforcing means that is made in at least one portion of the support pin has a concave or grooved cross section along the longitudinal direction of the support pins, and preferable that a concave or grooved section for the support pins be formed on the side of the mounting surface of the semiconductor element or on its opposite side.

Here, it is preferable that the concave or grooved section of the support pins be formed by press processing, or by stamping.

It is preferable that a reinforcing element be made in one piece with the support pins for the mounting pad, and in place of this, the support pins can be reinforced by increasing the thickness of certain section. It is also preferable that the adhesive used for fixing the semiconductor element fill the concave or grooved section of the support pins.

A depression for filling the adhesive used for fixing the semiconductor element can be formed in the mounting pad.

Preferably the lead frame has a support pin and a semiconductor element mounting section is used, and the bonding is preferably wire bonding.

It is desirable that insertion cavities for the support pins, along with an insertion cavity for the mounting pad, be formed in the heating element, and that the mounting pad insertion cavity formed in this heating element is larger than the mounting pad.

In the FIGS., 1, 41 are lead frame elements, 2 a lead frame external framework, 4 a positioning slot, 6 an outer lead, 7 an inner lead, 8 a lead frame section, 9 a dam bar, 10 an IC chip, 15 bonding wire, 16 sealing resin, 17 a bonding pad, 19 a capillary, 20 an arrow indicating direction, 22, 23, 24 zigzagged bent sections, 25 a mold frame used for resin sealing, 26 an ejection orifice, 31, 62 mounting pads, 32, 56, 57, 58, 59, 65, 68, 72 support pins, 33 represents a V-shaped groove, 34 adhesive, 38 a heating element, 39 a step, 51 an insertion cavity, 52 a linear cavity, 53 a semiconductor package, 54 a through-hole, and 70 is an inner lead clamp.

DETAILED DESCRIPTION

Figure 1:
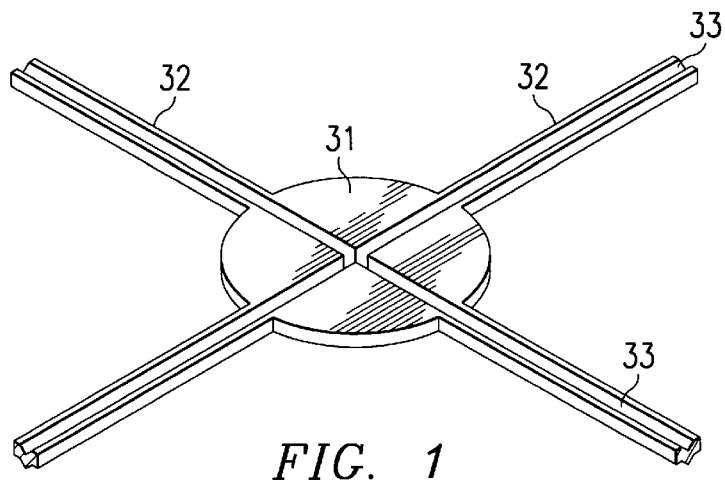
FIG. 1 is an oblique view of a mounting pad and support pin based on Embodiment 1 of the present invention.

FIGS. 1 to 17 show Embodiment 1 of the present invention. A mounting pad (small pad) 31 of this embodiment, and the configuration in which support pins 32 are integrally formed connecting radially to this mounting pad 31. Also, this is formed along with the lead frame by etching or stamping, and FIG. 1 shows a simplified mounting pad 31 and support pins 32.

The V-shaped cross section of this support pin 32, as illustrated, is an important distinctive feature. The cross section is processed from the flat plate configuration as in FIG. 2(*a*) into the V shape shown in (*b*) of this same fig., and the V-shaped groove 33 is formed in the upper surface. Also, this V-shaped groove 33 is also formed connecting the support pin 32 to the mounting pad 31 upper surface.

The method for forming the V-shaped groove 33 of the mounting pad 31 upper surface is by pressing, in the same manner as with the support pin. Also, it is permissible if the V-shaped groove is not provided on top of the mounting pad 31, and if the V-shaped groove 33 is provided localized on top of the support pin.

Figure 3:
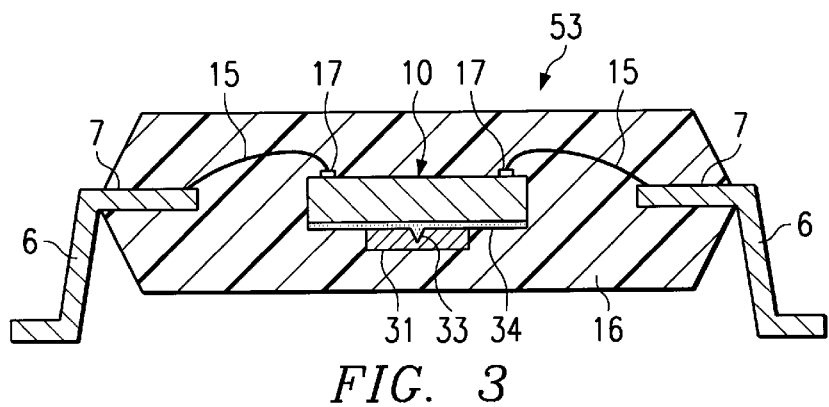
FIG. 3 is a cross section (cross section through line III—III of FIG. 5) of this same semiconductor package (semiconductor device).
Figure 5:
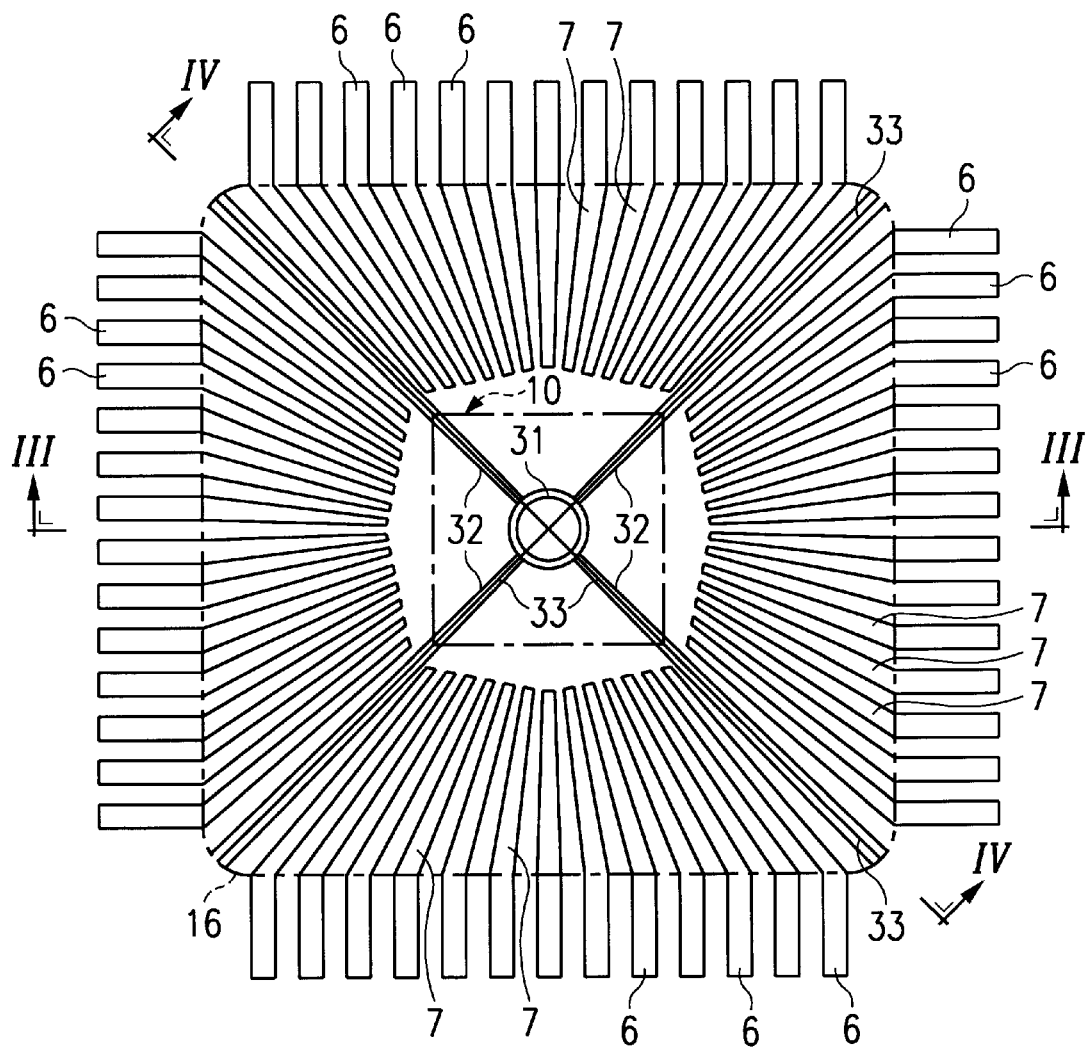
FIG. 5 is a cross section of the lead frame of this same package.

FIG. 3 is a front view showing the configuration in which the semiconductor package is resin-sealed based on conventional methods; it is a cross section through lines III—III of FIG. 5 showing the lead frame. As is clear from this fig., as was previously presented, the fact that the mounting pad 31 of this embodiment is smaller than the IC chip 10 is also an important distinctive feature.

Figure 4:
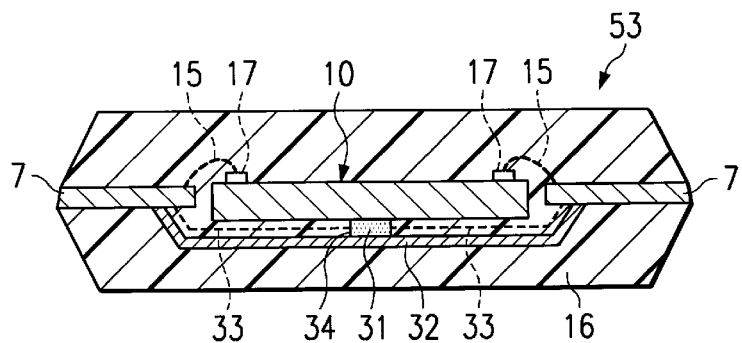
FIG. 4 is a cross section of this same package (cross section of FIG. 5 through line IV—IV).

FIG. 4 is a cross section through lines IV—IV of FIG. 5 showing this same resin sealed configuration, and FIG. 5 is a plan view of the lead frame. Because the mounting pad 31 is smaller than the IC chip 10 shown by the imaginary line in FIG. 5, as is illustrated, the support pins 32 are necessarily long, and unless some type of means is conceived, they are the main factor influencing warpage.

The surface area of the mounting pad 31 can be 15–40% of the chip size of the IC chip 10, but if the influence of stress due to misalignment of the IC chip 10 during the soldering (discussed below) or the amount of silver paste is considered, the smaller size is preferable. For example, when the size of the IC chip 10 is 8 mm×8 mm, it is suitable for the mounting pad 31 to be about 4 mm×4 mm (about 25% of the surface area of the IC chip 10).

Figure 6:
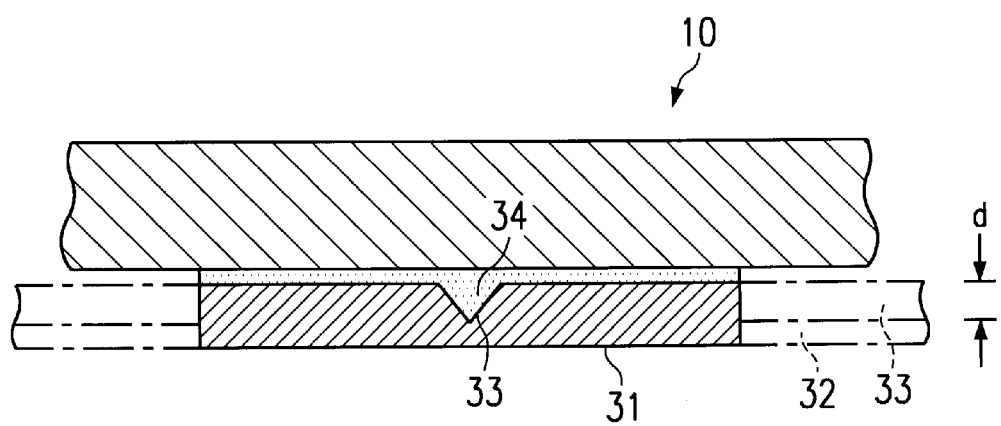
FIG. 6 an enlarged cross section of the same mounting pad to which an IC chip is fixed.
Figure 7:
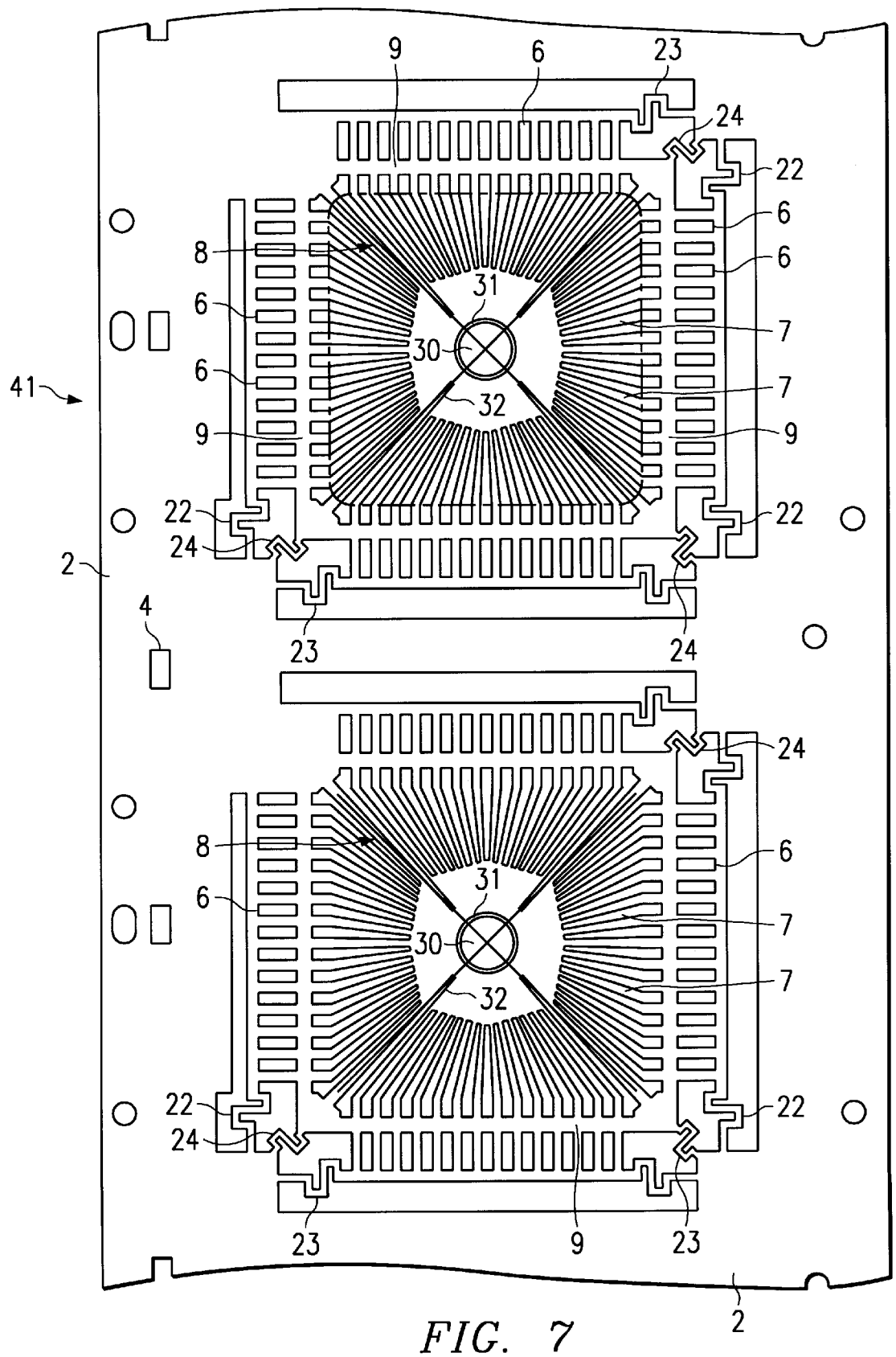
FIG. 7 is a plan view of one portion of this same lead frame.

As was presented above, this type of mounting pad 31, along with its support pin 32 (also each lead 6, 7 and the like), is formed in one piece as the lead frame 41 in FIG. 7 by etching or the like. Also, the depth (d) of the V-shaped groove 33 of the mounting pad 31 and the support pin 32 can be about 80 μm, as shown in FIG. 6.

In the the frame 41, only one of the corners (FIG. 7, the upper right corner) of the four corners of the lead frame section 8 is directly fastened to the lead frame external framework 2, and the other three corners are linked to the lead frame outer framework 2 by the three zigzagged bent sections 22, 23, 24, respectively. By this lead frame 41, even if a temperature difference is created between the external framework 2 and the lead frame section 8 during thermal processes such as wire bonding, the distortion stress that can be generated, such as up and down, or right and left, can be effectively absorbed by the elastic deformation of the bent sections 22, 23, 24. As a result, the dimensional positioning precision (spacing of the leads and the like) of the lead frame section 8 itself is improved, and since there is no distortion of the lead frame element itself, the transport of the IC chip 10 to the lead frame for the mounting and wire bonding processes becomes simplified.

Moreover, when resin-sealing after the mounting of the IC chip, even if a force is generated which will pull the leads 6, 7 due to the shrinking of the resin, this is absorbed due to the deformation of the bent sections 22, 23, 44, and thus, distortion and deformation of the lead frame element can be prevented, and the reliability of moisture-resistance and the like is also improved.

Next, the processes in which the IC chip 10 is mounted and bonded by using the lead frame 41 are explained.

First, the IC chip 10 is fixed (mounted) to the mounting pad 31 by silver paste 34, as in FIG. 6. The silver paste 34 has been coated beforehand on top of the mounting pad 31.

Figure 8:
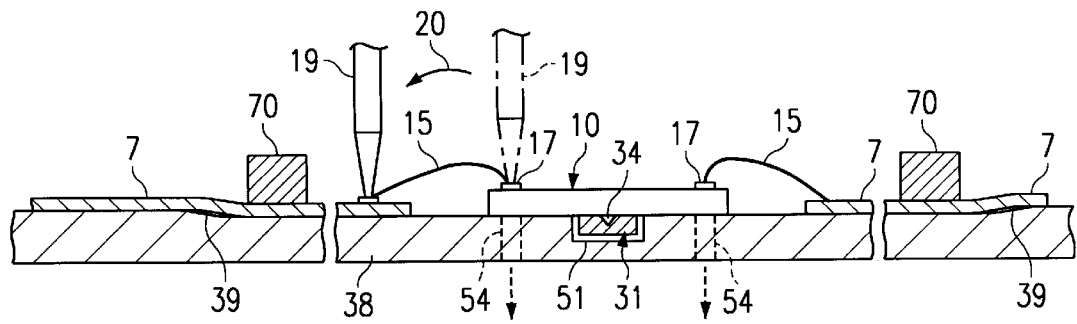
FIG. 8 is a cross section of the important elements during wire bonding.
Figure 9A:
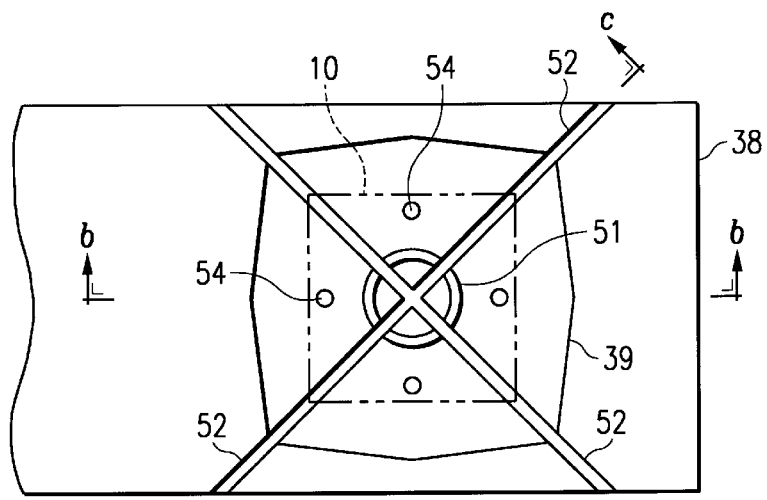
FIG. 9 shows the heater insert used in this same wire bonding, (a) of this same fig. is a plan view, (b) of this same fig. is a cross section of (a) of this same fig. through line b—b, and (c) of this same fig. is a cross section of the same through line c—c.
Figure 9B:
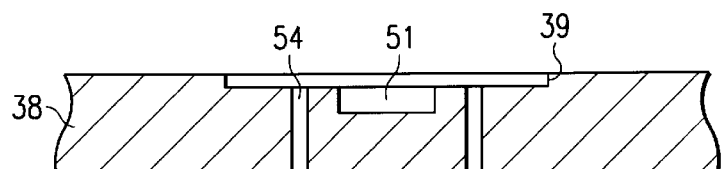
Figure 9C:
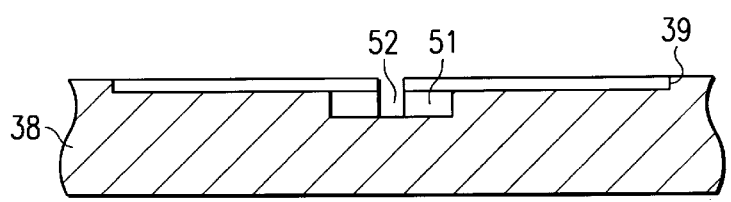

Next, as shown in FIG. 8 and FIG. 9, the heating element (heater insert) 38 is prepared, wherein rectangular cavity 51 and the radiating cavities (grooves) 52 are provided for inserting the mounting pad 31 and support pins 32.

Figure 10:
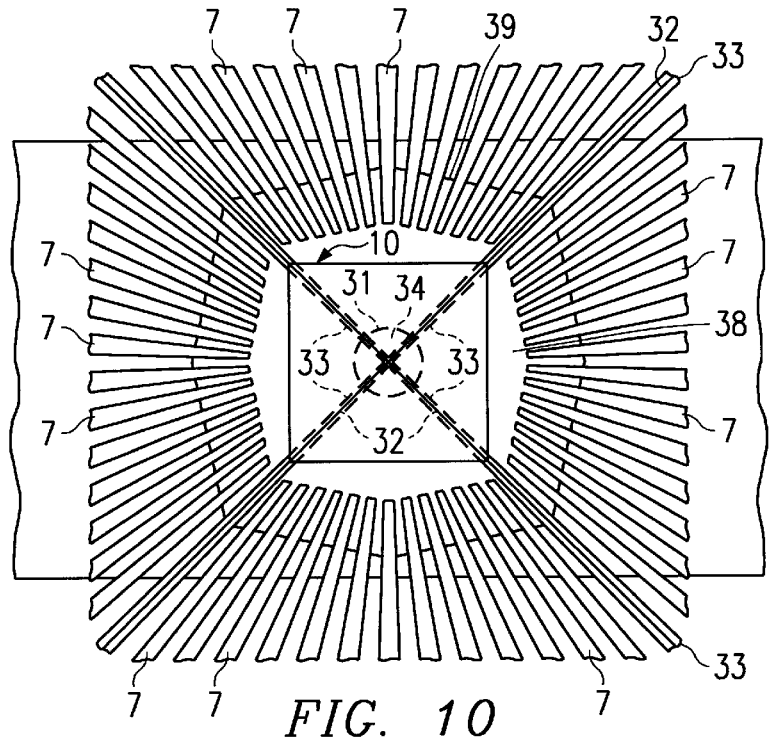
FIG. 10 is a plan view of the important sections during wire bonding.

Next, as shown in FIG. 10, when the mounting pad 31 and the support pins 32 are inserted in each of the cavities (omitted from the fig.) that are provided in the heating element (heater insert or heater block), the IC chip bottom surfaces come in contact with the heating element. Also, at the periphery of the IC chip, because step 39 is provided in the heating element surface, the ends of the inner leads 7 are depressed by the inner lead clamp 70 (refer to FIG. 8) and make contact with the heating element, and as will be described below, a contact that is stabilized both thermally and mechanically is ensured, and it becomes possible to conduct reliable bonding. At the periphery of the IC chip, a spacing of less than about 500 μm can be provided between each of the cavities 51 and 52 and the mounting pad 31 and support pins 32 (refer to FIG. 8 and FIG. 9; not illustrated in FIG. 10).

As for the wire bonding, in the same manner as previously presented, wires 15 are bonded to the pads 17 by capillaries 19 while applying heat and ultrasonic energy, and are further guided towards the inner leads 7 as shown by the arrow 20, and pressure bonded.

At this time, even if the mounting pad 31 is formed small as was mentioned above, it is sufficiently supported on heater insert 38, and furthermore, since rigidity is imparted to the support pins 32 by forming the support grooves 33, the wire bonding can be stably conducted, the heat from the heater can be directly transmitted from the heater insert 38 to the IC chip 10, and there is no loss of thermal efficiency. The bonding can also be conducted by a beam lead system instead of wire bonding.

Through-holes 54 are provided in the heater insert 38 as shown by the broken lines, and the IC chip 10 can be drawn on top of the heater insert 38 by vacuum through these through-holes and stably supported. Also, IC chip 10 can be mechanically fastened to the heater insert 38 by a clamp (not illustrated) or the like.

Figure 11:
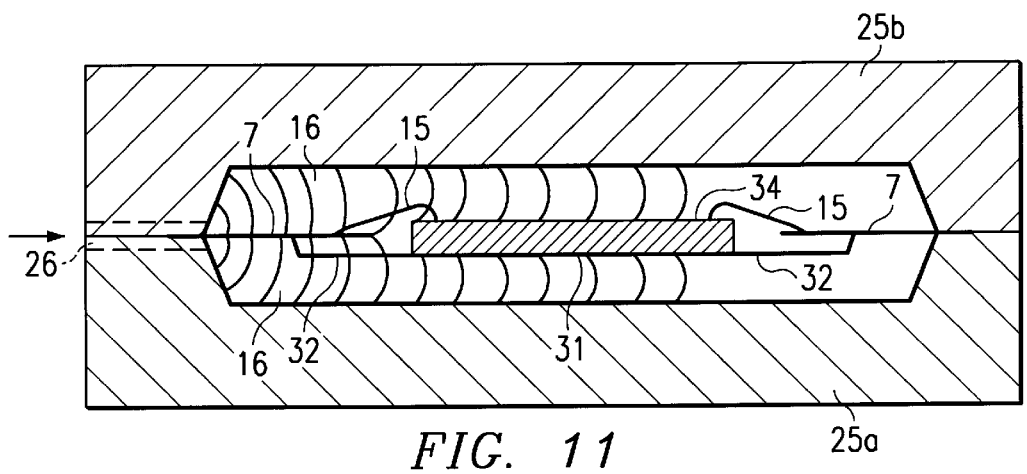
FIG. 11 is a simplified cross section of the important sections showing the condition during the resin sealing of the semiconductor device.
Figure 12:
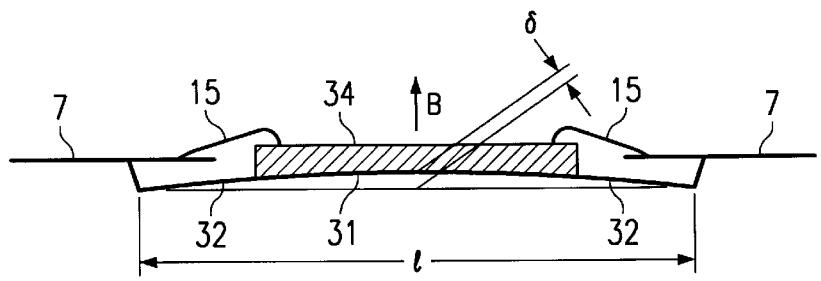
FIG. 12 is a simplified view of the important sections of the semiconductor device in which warping is generated in the support pin.

As for the semiconductor device of the process, after the wire bonding is completed by forming a transfer mold by using resin 16 as shown in FIG. 11, as was shown in FIG. 3, the unnecessary portions of the external leads 6 are cut, and the semiconductor package 53 is completed.

However, in the event it is formed without the means for imparting rigidity, as in this embodiment, warping occurs in support pins 32 as was previously mentioned. If in FIG. 12 the bending (warp) of the support pins 32 is taken to be σ, and the overall length of the support pins is 1, this phenomenon can be explained according to the deformation theory from the following formula.

$\delta = Pl^3/48E.I$

δ: warp

P: Force l: Length of deformation

E: modulus of bending elasticity

I: Second moment

Figure 2A:
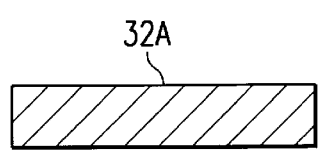
FIG. 2 shows the essential processing of this same support pin: (a) is an enlarged cross section showing the shape before processing, and (b) shows the shape after processing.
Figure 2B:
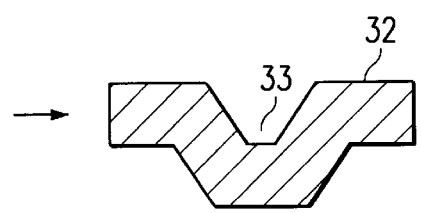

In other words, as shown in FIG. 2, by making a V shape in a support pin of a flat shape, surface area second moment related to the support pin neutral axis can be improved. It can be seen from the equation that due to the fact that the bending is inversely proportional to the secondary moment of the cross section, the bending can be reduced by increasing the secondary moment of the cross section of the support pin as mentioned above.

Figure 13:
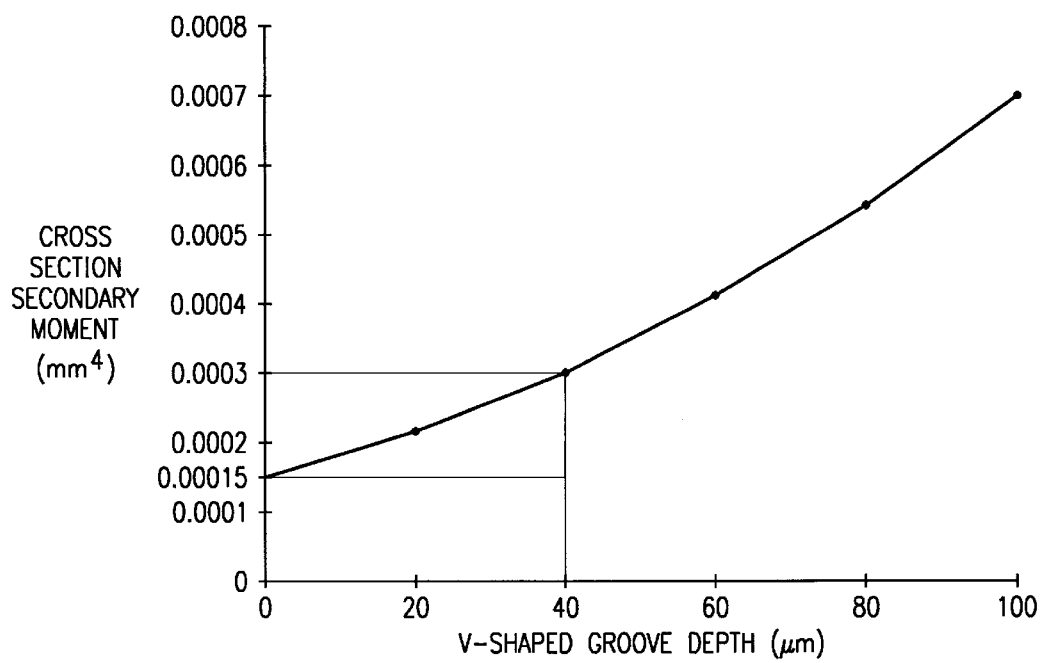
FIG. 13 is a graph showing the incline direction of the secondary moment of the cross section accompanying the depth of the V-shaped groove of the support pin.

A V-shaped groove is made in the support pin 32, and FIG. 13 is a graph showing the increase in the secondary moment of the cross section I due to the depth of this V-shaped groove. It can be seen from FIG. 13 that, for example, by forming a V-shaped groove of a depth of 40 μm in the support pin 32, compared to the case when a V-shaped groove is not made, the secondary moment of the cross section increases from 0.00015 mm$^4$ to 0.0003 mm$^4$. In other words, the bending of the support pin 32 goes from 1/0.00015 to 1/0.0003, and is reduced 50%, since it is inversely proportional.

Figure 14:
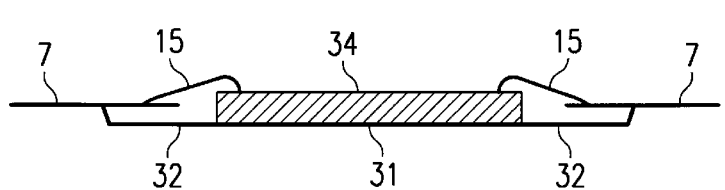
FIG. 14 is a simplified view of the important components of the semiconductor device.

As has been clarified from the theory, by imparting rigidity to support pin 32 by forming a V-shaped groove as shown in FIG. 14, the generation of warpage in the support pin 32 is remarkably reduced or prevented even after the wire bonding, and it can fulfill its role under theoretical conditions.

Figure 15:
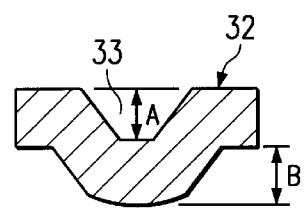
FIG. 15 is an enlarged cross section view of a support pin based on Embodiment 1 of the present invention.

Based on nine samples of a support pin 32 that were optionally selected where the V-shaped groove was formed, the results of measuring the depth A of the groove and the amount of protrusion B on the opposite side shown in FIG. 15 are shown in the following Table I.

TABLE I

|  | Depth of V-shaped groove ($\mu$m) | |
| --- | --- | --- |
|  | A | B |
| Minimum depth | 85.0 | 73.0 |
| Maximum depth | 93.0 | 80.0 |
| Average depth | 88.7 | 76.5 |
| Standard deviation | 2.36 | 2.17 |

Figure 17:
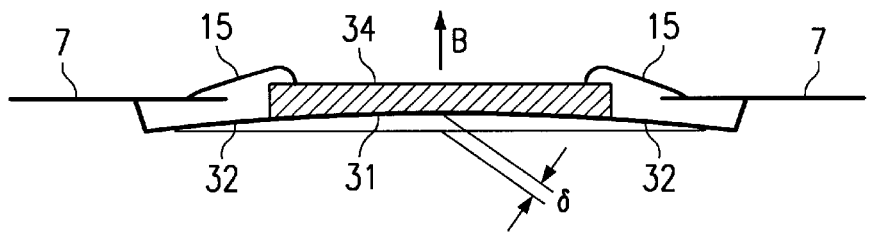
FIG. 17 is a view showing the measuring point for the warping of the support pin.

Next, the results (average values) of measuring the differences in the warping of the support pin depending on the presence or absence of the V-shaped groove for three pieces each of support pins in which the V-shaped groove was made, and support pins in which the V-shaped groove was not made, are shown in the following Table II. These measurements, as shown in FIG. 17, were measured by a focal point depth scale which used the center of the support pin as the measuring point. As for measuring the warpage, in addition to conducting the measurement of the warpage after setting the assembly in the heating element before and after wire bonding, the measurements were conducted under the condition in which the bonding wires were completely cut off after the wire bonding. These are measurements for confirming the amount of warpage generated by each process.

TABLE II

|  | Warpage of support pin ($\mu$m) | |
| --- | --- | --- |
|  | With groove | Without groove |
| Before wire bonding (after die attachment cure) | 25 | 36 |
| After wire bonding | 31 | 160 |
| After wire bonding and cutting off all wires | 27 | 56 |

Figure 16:
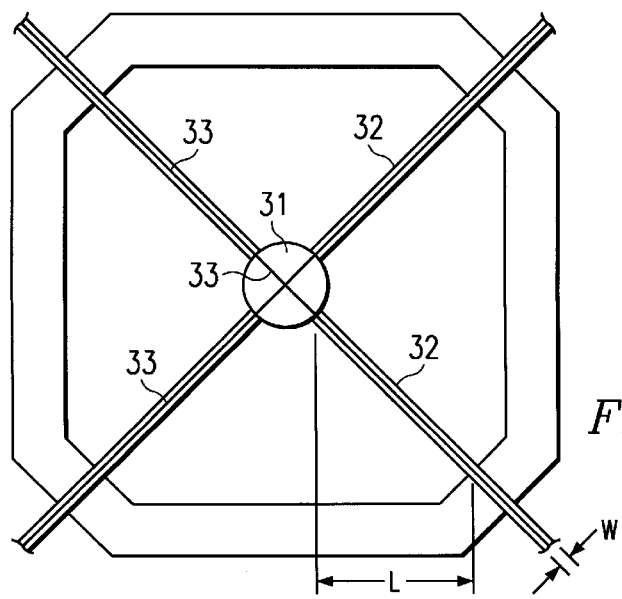
FIG. 16 is a plan view of the important sections showing the support pin and a measuring method used for samples for measuring warping of the support pin.

FIG. 16 shows the support pin used for the samples supplied in this measuring. In order to clarify the difference due to the presence or absence of the V-shaped grooves, the lead frame size was 24 mm×24 mm, with 176 inner leads made of copper, long support pins were used, the width (W) of the support pins was 0.254 mm and the thickness 0.127 mm. Also, the samples of the size, as shown in FIG. 16, were measured by fastening by a Kaputon [transliteration] tape (T) at a position of 11 mm (L) from the edge of the mounting pad 31.

As a result, the fact became clear that warping occurs during wire bonding, as shown in Table II. Also, even if a V-shaped groove is formed in the support pin, some warping occurs due to the wire bonding. Moreover, it can be seen that once the bonding wires are cut off, the damage remains.

However, when the support pin with the V-shaped groove is compared with the one without the V-shaped groove, the change due to the warpage is small, and the effects of imparting rigidity by the V-shaped groove are remarkable.

Above an explanation was given in regard to Embodiment 1, but according to this embodiment, as was mentioned above, particularly in the case of the small pad 31, by imparting rigidity due to the V-shaped groove of the support pins 32, if a portion of the IC chip 10 is warped by the pulling due to the bonding wire 15 at the time of bonding, it [the warping] is extremely slight. Therefore, since it is resin-sealed under this condition, the resin 16 is injected with the same speed into the upper and the lower mold cavities, and there is no increasing in the warpage by the support pins 32 being pushed up further due to the resin 16.

Therefore, in the case of the support pin of the small pad of the prior art, as for the IC chip size carried, the distance from the pad edge to the IC chip edge was limited to 6 mm, and if 6 mm was exceeded, an additional pad was provided midway in the support pin as a means to prevent warping; however, this is unnecessary and the IC chip size is less restricted.

FIGS. 18 to 27 show variants of Embodiment 1.

Figure 18:
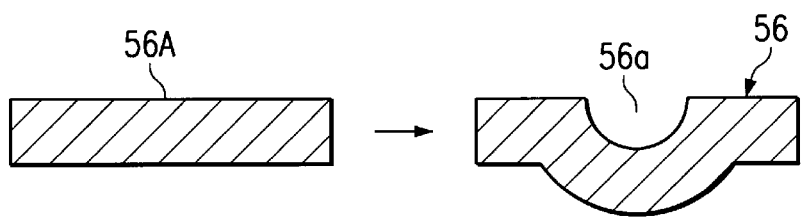
FIG. 18 is a simplified cross section showing the forming method for another shape of the support pin.

FIG. 18 shows that a support pin 56 is processed with a concave section 56a of an almost semicircular cross section from a flat plate shape 56, in place of the one in which a V-shaped groove was formed in the support pin in Embodiment 1. Also, FIG. 19 shows a support pin 57 having a convex section 57a processed in the same manner from a flat plate shape 57A, and the mirror image of that of FIG. 18.

Figure 19:
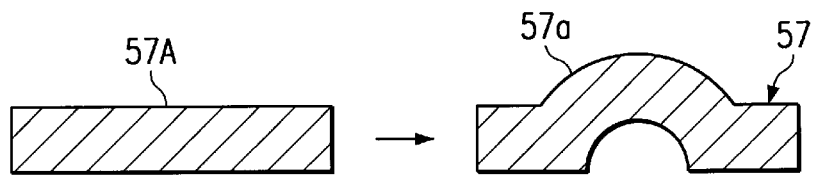
FIG. 19 is a simplified cross section showing the forming method for another shape of the support pin.

Therefore, the concave section 56a of FIG. 18 that increases the secondary moment of the cross section opposes the compression stress (the same as the V-shaped groove) in relation to the upward warping, and the convex sections 57a of FIG. 19, conversely, oppose the tensile stress. Also, in either case, the secondary moment of the cross section is the same, and there is no difference from the standpoint of strength, but in the case of FIG. 19, because the convex sections 57a hinder the IC chip support, it is a construction which can be applied only to limited portions outside of the IC chip support region.

Also, as for the silver paste used for IC chip bonding, in addition to being provided on top of the mounting pad in the same manner as in Embodiment 1, in the case of FIG. 18, it is also provided in concave section 56a.

Therefore, according to these variants, the warping of the support pin is prevented in the same manner as in Embodiment 1, and along with reducing the restriction on the IC chip size carried, in the case of FIG. 18, due to the fact that the adhesive is also provided in the groove of the support pin, it provides the effect of increasing the stability of the IC chip bonding.

Figure 20:
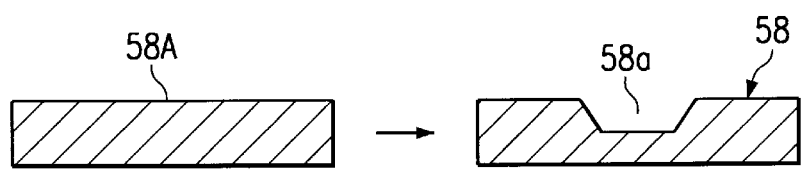
FIG. 20 is a simplified cross section showing the forming method for another shape of the support pin.
Figure 21:
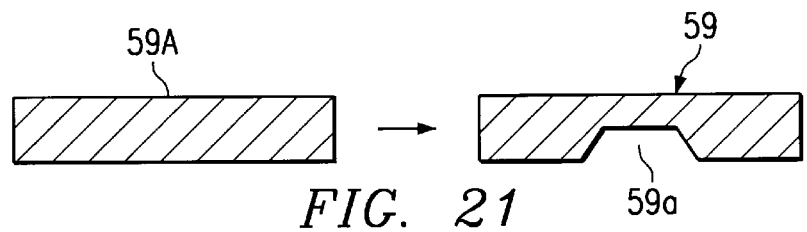
FIG. 21 is a simplified cross section showing the forming method for another shape of the support pin.

Also, FIG. 20 shows a support pin 58 with a groove 58a with a frustum cross section by stamping a flat plate 58A instead of the V-shaped groove formed in the support pin in Embodiment 1. Also, FIG. 21 shows the support pin 59 with groove 59a formed in the same manner in the bottom surface from flat plate shape 59A opposite to that of FIG. 20.

Therefore, this design has approximately the same function as the variant (FIG. 18 and FIG. 19), and exhibits the same resistance to the same type of bending. However, there is no increase in the secondary moment of the cross section, but the modulus of elasticity is increased by the stiffening process by compression of the groove due to the stamping, and the insufficiency of the secondary moment of the cross section is compensated.

In the cases of these various examples also, the adhesive for the IC chip, in addition to being provided on top of the mounting pad in the same manner as described in Embodiment 1, is also provided in the groove 58a as shown in FIG. 20. Also, since there is no hindrance to the IC chip in the manner of the variant of FIG. 19, there are no limitations on the regions of this stamping process.

Therefore, according to these various examples, in addition to there being approximately the same effects as in Embodiment 1, FIG. 20, in the same manner as in the case of the variant of FIG. 18, can provide the effect that the stability of the IC chip fastening is increased.

Also, as for the constructions based on the variants shown in FIGS. 18 to 21, except for the case of FIG. 19, the entire body including the mounting pad section can be formed, and the construction can be sufficiently provided in the support pin.

Figure 22:
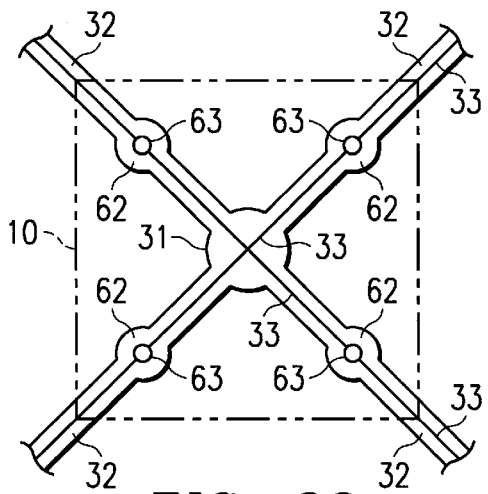
FIG. 22, is a plan view of the important sections of the lead frame in a variant of Embodiment 1.

In the variant of FIG. 22, besides the mounting pad 31, additional mounting pads 62 are provided in a circular form in the support pins 32, and cavities 63 are provided in these mounting pads 62 by partial etching or the like. Therefore, the V-shaped grooves 33 of the support pins 32 are locally provided in the regions other than the mounting pads 62.

Figure 23:
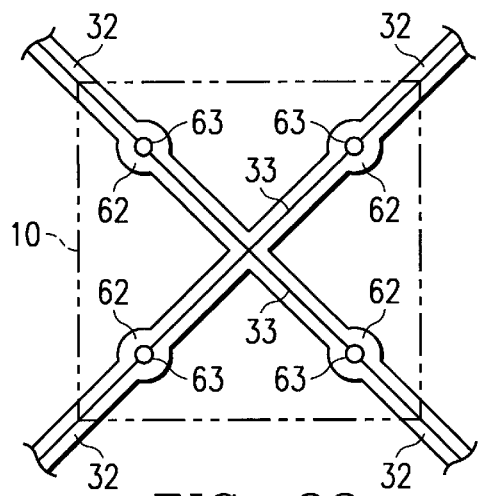
FIG. 23 is a plan view of the important sections of a lead frame in a variant of Embodiment 1.
Figure 24:
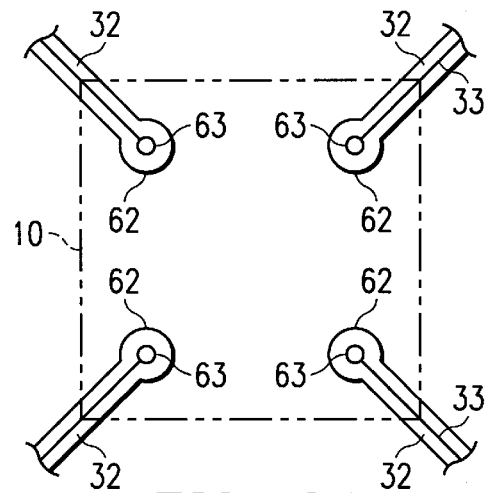
FIG. 24 is a plan view of the important sections of a lead frame in a variant of Embodiment 1.

Also, as a variant similar to the variant of FIG. 22, the constructions shown in FIG. 23 and FIG. 24 can be suggested. As is illustrated in FIG. 23, there is no mounting pad in the center section, and the V-shaped grooves 33 provided in the support pins 32 are formed by also passing through the concavities 63 that are respectively provided in the additional mounting pads 62. Also, when the variant of FIG. 24 is compared to the variants of the FIG. 22 and FIG. 23, there is no center section, and it is formed so that the IC chip 10 is supported by the support pins 32 on the outside from the additional mounting pads 63 [sic; 62]. Also, the V-shaped grooves 33 that are provided in the support pins 32 are connected to the concavities 63 of the mounting pads 62.

In either of the variants of FIG. 22 and FIG. 23, the adhesive is filled in the V-shaped grooves 33 of the support pins 32 and the concavities 63 of the mounting pads 62, and the IC chip 10 is fixed by this means. Besides circular, the shape of the additional mounting pads 62 that are provided in the variants may be triangular, rectangular, other polygonal shapes, or elliptical.

Therefore, according to these variants, along with having about the same effect as in the case of Embodiment 1, the effect of increasing the degree of fastening of the IC chip is provided.

Figure 25:
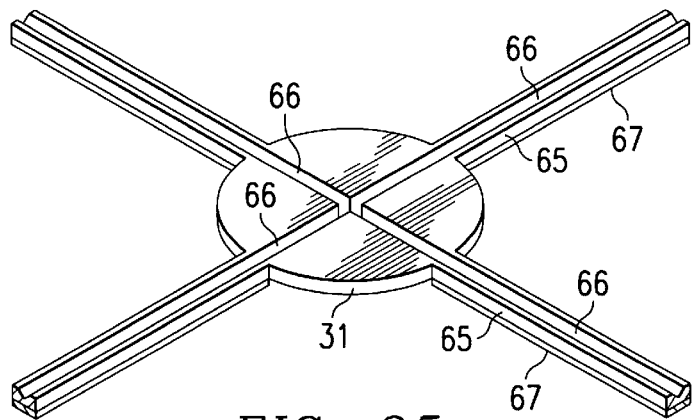
FIG. 25 is an oblique view of a lead frame and support pins in a variant of Embodiment 1.
Figure 26:
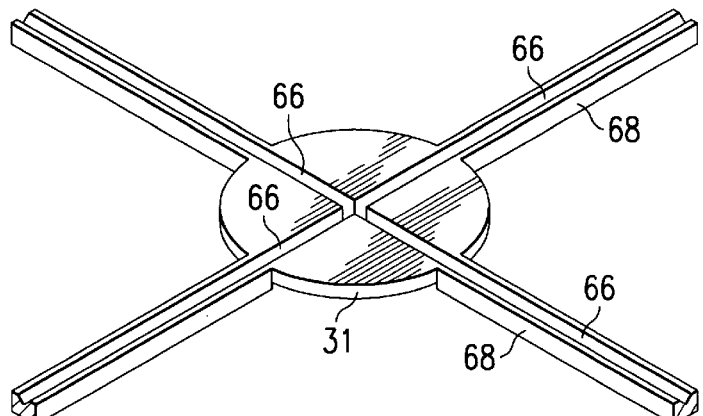
FIG. 26 is an oblique view of a lead frame and support pins in a variant of Embodiment 1.

The variants of FIG. 25 and FIG. 26 are similar, and have a shape that is also similar to Embodiment 1. However, they differ from Embodiment 1 in that in both the V-shaped grooves 66 of the support pins are not made by pressing, but are formed by partial etching. Therefore, there is no protruding section on the opposite side surface of V-shaped groove 66, which is flat.

Also, as for the difference between FIG. 25 and FIG. 26, in the case of FIG. 25, a flat plate-shaped reinforcing element 67 is integrally bonded on the opposite side face of the V-shaped groove 66 of the support pin 65, and in FIG. 26, the support pin 68 is made from a thick material. Therefore, in the example of FIG. 25, the rigidity of the support pin 65 is increased by reinforcing element 67, and in the example of FIG. 26, the rigidity of the support pin 68 is increased by increasing its thickness.

In either fig., the V-shaped grooves 66 that pass through from the support pins 65, 68 to the mounting pad 31 jointly have a concave area for holding the adhesive that is used for bonding the IC chip. Also, both have about the same effects as Embodiment 1, and the effect that the adhesion for the IC chip is increased.

Figure 27:
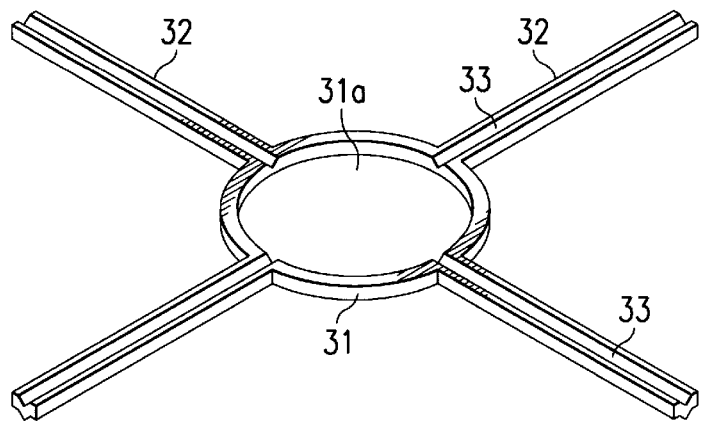
FIG. 27 is an oblique view of a lead frame and support pins in a variant of Embodiment 1.

In the variant of FIG. 27, the concave area 31a used for holding the adhesive used for bonding the IC chip to the mounting pad 31 of Embodiment 1, and the other sections, are formed in the same manner as Embodiment 1. Further, in the same manner as with the other variants, the V-shaped groove 33 of the support pin 32 is also used to hold the adhesive used for bonding the IC chip.

Therefore, according to this example, along with having about the same effect as Embodiment 1, by the adhesive that is held in the V-shaped groove of support pin 32 and concave area 31a of the mounting pad 31, the adhesive surface area is increased, and it has the effect of bonding the IC chip more firmly.

Several variants of Embodiment 1 were explained above, but in Embodiment 1, the forming of the V-shaped groove was for strengthening the resistive force against bending by imparting rigidity to the support pin. In contrast, in each of the variants, the cavity and V-shaped groove of the support pin can be said to be used jointly as a means of strengthening the resistive force against bending and for holding the adhesive.

Figure 28:
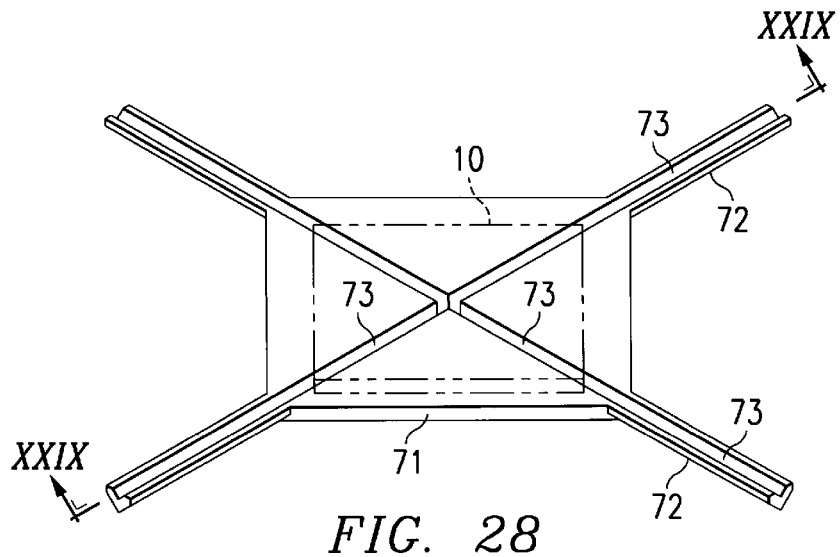
FIG. 28 is an oblique view of a lead frame and support pins based on Embodiment 2 of the present invention.
Figure 29:
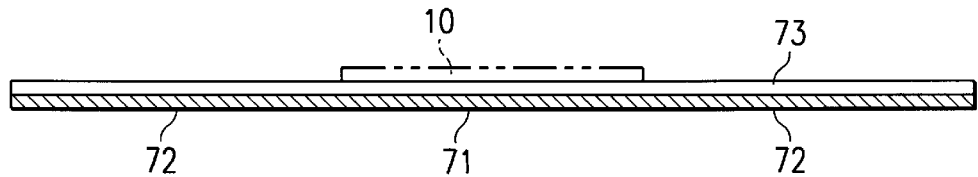
FIG. 29 is a cross section of FIG. 28 through line XXIX—XXIX.
Figure 30:
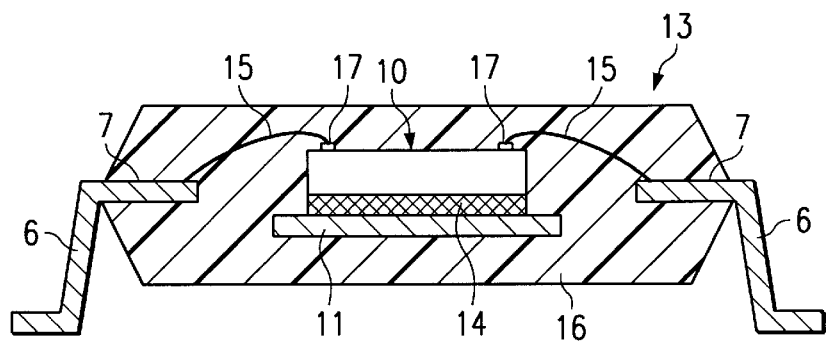
FIG. 30 is a cross section of a semiconductor package (semiconductor device) based on an example of the prior art.
Figure 31:
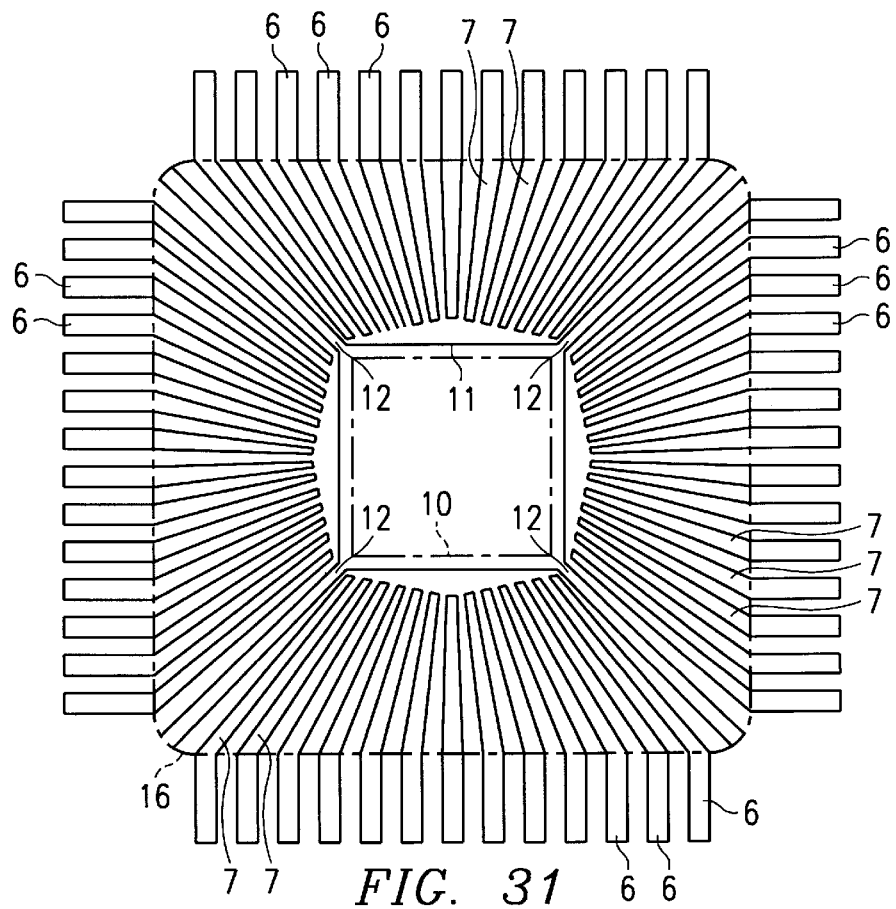
FIG. 31 is a plan view of the lead frame section of this same package.
Figure 32:
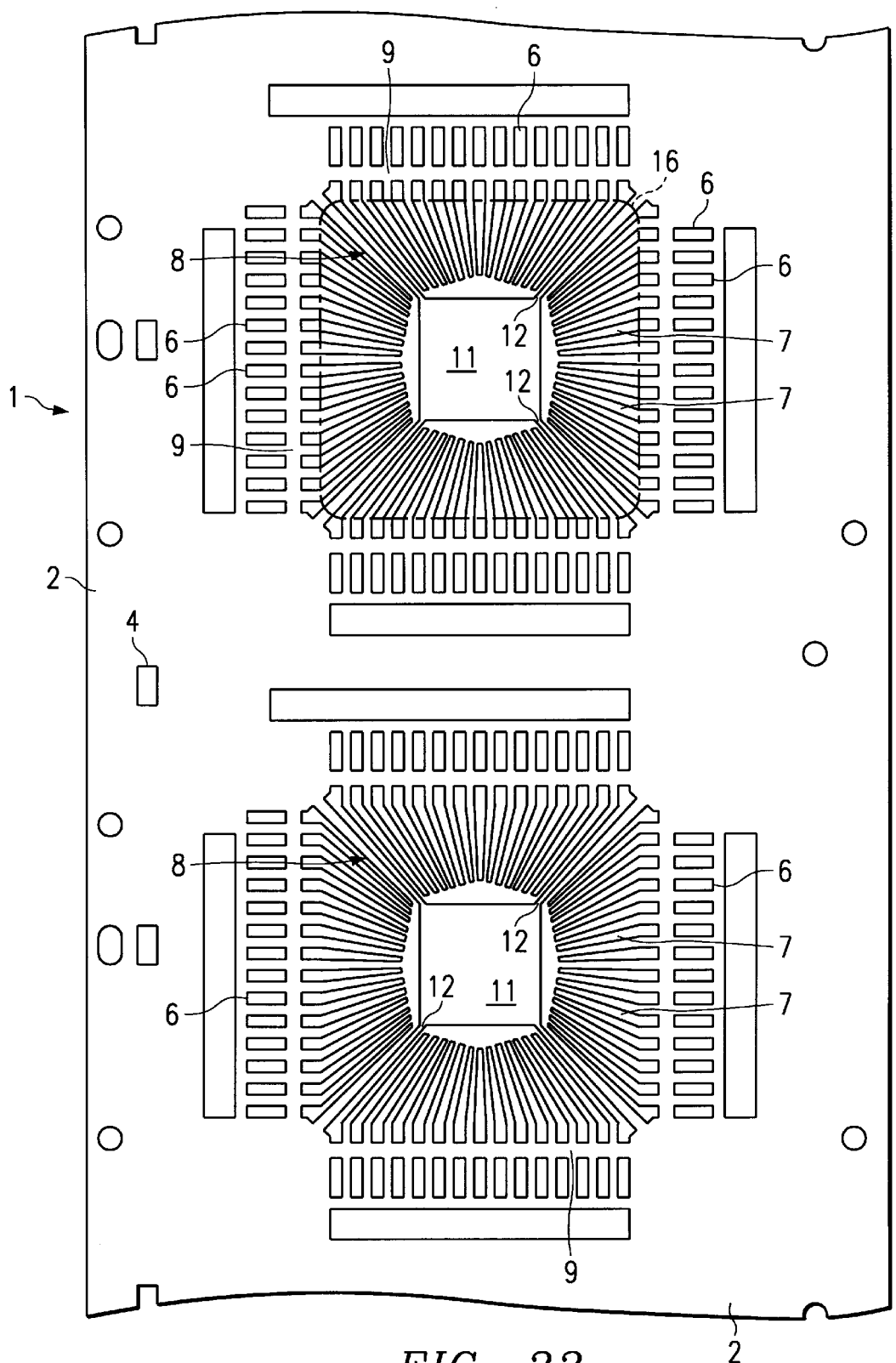
FIG. 32 is a plan view of one portion of this same lead frame.
Figure 33:
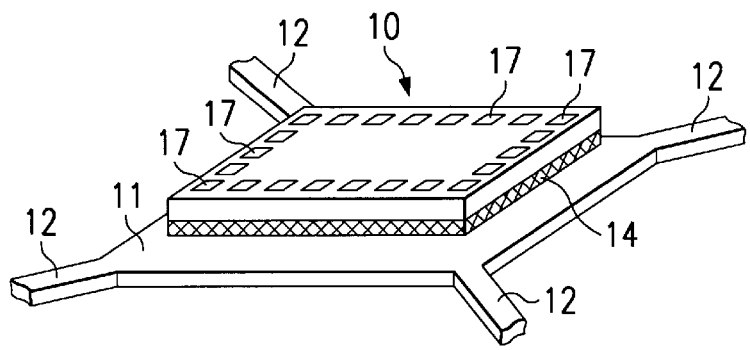
FIG. 33 is an enlarged oblique view of the condition wherein an IC chip is mounted on the mounting pad of this same lead frame.
Figure 34:
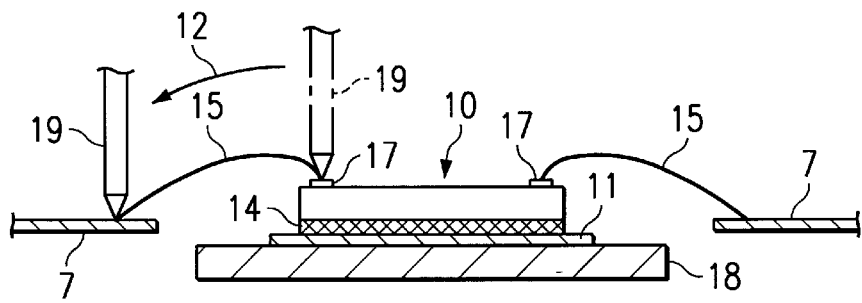
FIG. 34 is a cross sectional view of the important sections during the wire bonding of the same.
Figure 35:
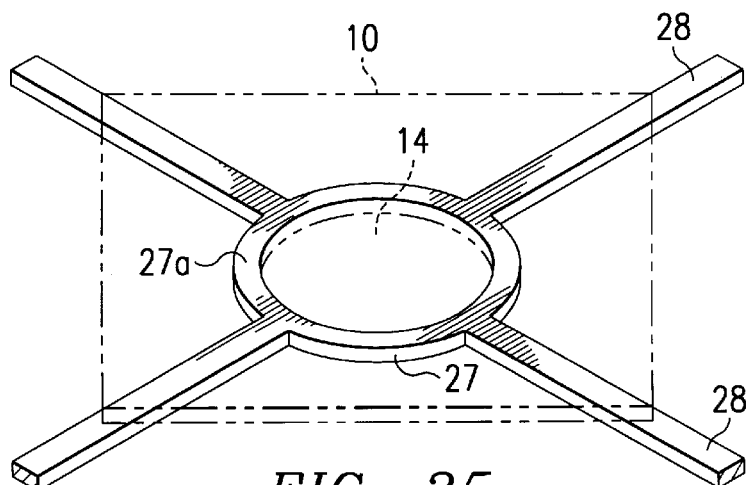
FIG. 35 is an oblique view of a small pad and support pins based on the invention of the previous application.
Figure 36:
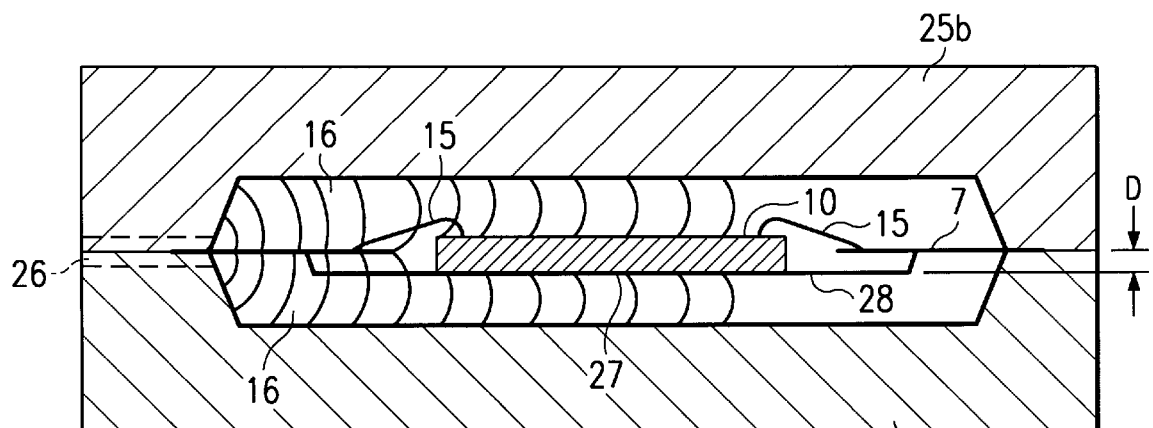
FIG. 36 is a simplified cross section of the important sections showing the package configuration of a semiconductor device which uses this same small pad.
Figure 37:
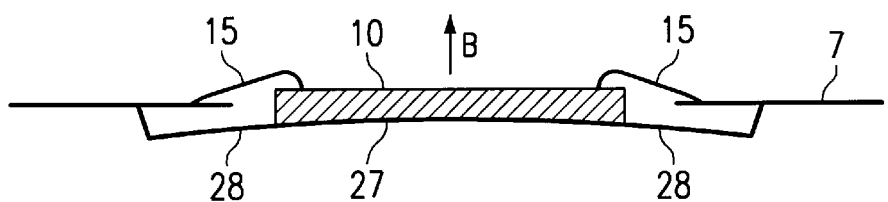
FIG. 37 is a simplified view of the important sections of a semiconductor device in which warping of the support pins has occurred.
Figure 38:
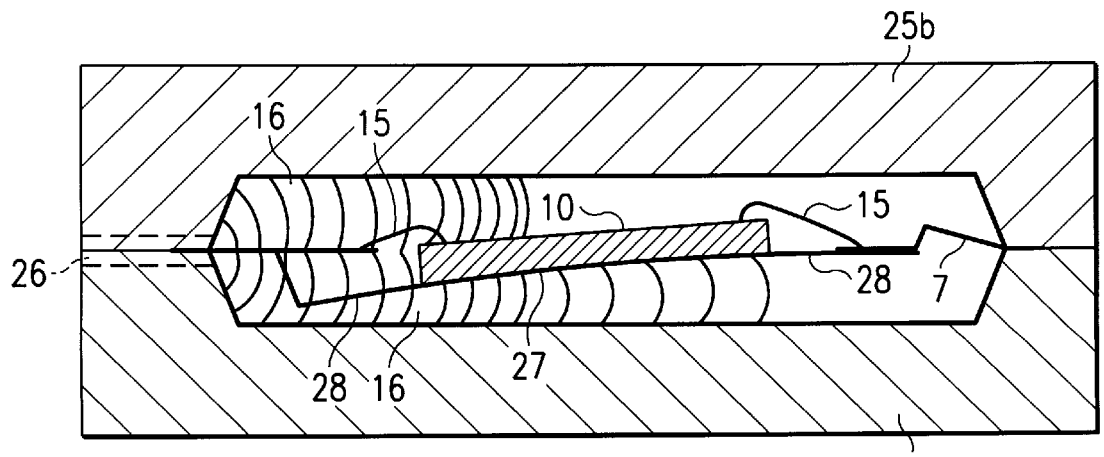
FIG. 38 is a simplified cross section of the important sections showing the package configuration of a semiconductor device in which this same warping has occurred.

FIG. 28 is an oblique view in the same manner as FIG. 1 showing Embodiment 2, and FIG. 29 is a cross sectional view of FIG. 28 through XXIX—XXIX.

Embodiment 1 was an example of a pad that was smaller than the IC chip that was carried and its support pins, but because this embodiment concerns a mounting pad of ordinary size and its support pins, the size of each section becomes larger compared to Embodiment 1.

As for the shape, in the same manner as Embodiment 1, mounting pad 71, and the support pins 72 that are connected radially from this mounting pad 71, are formed in one piece. Also, as is illustrated in this example also, a V-shaped groove construction also applied to the support pins 72, and the rigidity is increased.

The adhesive used for bonding the IC chip 10 is held in the V-shaped groove 73. Therefore, even in this example, the V-shaped groove 73 is simultaneously an important element for both holding the adhesive and ensuring the rigidity of the support pin 72. Even in this example, besides rectangular, the shape of the mounting pad 71 can be circular, polygonal, or elliptical.

Therefore, according to this embodiment, accompanying the increase in the resistive force against bending of the support pin 72 by a design which imparts rigidity, it further exhibits this effect due to the bonding wire during the wire bonding. In this manner, the imparting of rigidity to the support pin is not limited to the small pad, and its effect is significant due to the fact that it is also applied to pads other than the small pad.

Above, embodiments of the present invention were explained, but as for the embodiments, further modifications are possible based on the technical concept of the present invention.

For example, the shape of the cross section and the size can be variously modified for imparting rigidity to the support pins. Also, there can be variations from the standpoint of materials, the lead frame material can be alloy 42, copper alloy, or metals such as copper; the adhesive can be an adhesive other than the silver paste, the heater insert can be stainless steel, and so on.

Also, the same type of construction as for the lead frame can also be applied to other convenient types of lead frames. The bonding is also not limited to the wire bonding.

The present invention can be applied not only to the QFP package where the terminals (leads) are along the four sides, but also to the dual in-line package and the like.

As for the semiconductor device based on the present invention, since rigidity is applied to at least one portion of the support pins for supporting the mounting section for the semiconductor element, the deformation of the support pins due to the load during manufacturing processes such as wire bonding and resin sealing can be suppressed. As a result, the semiconductor element supported on the support pins can be properly and reliably positioned.

We claim:

1. A semiconductor device comprising:

a semiconductor element; and a mounting pad for said semiconductor element attached to a lead frame by at least one support pin, at least one portion of said support pin having a concave or grooved axial cross section along a longitudinal direction of said support pin, whereby rigidity of said support pin is increased.

2. The semiconductor device of claim 1 wherein the semiconductor element is bonded to an inner lead section at a side of its circuit forming surface.

3. The semiconductor device of claim 1 wherein a support pin is connected to the mounting pad for the semiconductor element, and is resin-sealed so that the semiconductor element is mounted on the mounting pad.

4. The semiconductor device of claim 3 wherein the surface area of the mounting pad is smaller than that of the semiconductor element.

5. The semiconductor device of claim 1 wherein the concave or grooved section of the support pin is formed in the semiconductor element mounting surface or its opposite side.

6. The semiconductor device of claim 1 wherein the concave or grooved section of the support pin is formed by pressing.

7. The semiconductor device of claim 1 wherein the concave or grooved section of the support pin is formed by stamping the support pin.

8. The semiconductor device of claim 1 wherein a reinforcing element is made in one piece with the support pin for the mounting pad.

9. The semiconductor device of claim 1 wherein the support pin is reinforced by increasing its thickness.

10. The semiconductor device of claim 1 wherein the adhesive used for fixing the semiconductor element is filled in the concave or grooved section of the support pin.

11. The semiconductor device of claim 1 wherein a concave area is formed in the mounting pad for applying the adhesive used for fixing the semiconductor element.

12. A lead frame for a semiconductor device having the support pin and semiconductor element mounting pad of claim 1.

13. A manufacturing method for the semiconductor device of claim 1 wherein a heating element is made to contact the mounting pad and the support pin of the lead frame of claim 12, and the semiconductor element that is fixed on top of the mounting section is bonded to the inner lead pad of the lead frame.

14. The manufacturing method of claim 13 wherein the bonding is wire bonding.

15. The manufacturing method of claim 13 wherein, along with an insertion concave area for the mounting pad, an insertion concave area for the support pin is formed in a heating section.

16. The manufacturing method of claim 15 wherein the insertion concave area for the mounting pad that is formed in the heating section is larger than the mounting pad.

* * * * *